(12) United States Patent
Ko et al.

(10) Patent No.: US 10,930,716 B2
(45) Date of Patent: Feb. 23, 2021

(54) ELECTROLUMINESCENT DISPLAY DEVICE WITH FLATNESS IMPROVEMENT OF EMISSION LAYER

(71) Applicant: LG Display Co., Ltd., Seoul (KR)

(72) Inventors: Hyunil Ko, Paju-si (KR); HongKi Park, Goyang-si (KR)

(73) Assignee: LG Display Co. Ltd., Seoul (KR)

( * ) Notice: Subject to any disclaimer, the term of this patent is extended or adjusted under 35 U.S.C. 154(b) by 0 days.

(21) Appl. No.: 15/820,094

(22) Filed: Nov. 21, 2017

(65) Prior Publication Data

US 2018/0182830 A1    Jun. 28, 2018

(30) Foreign Application Priority Data

Dec. 28, 2016 (KR) .................. 10-2016-0181404

(51) Int. Cl.
    *H01L 27/32* (2006.01)
(52) U.S. Cl.
    CPC .... *H01L 27/3246* (2013.01); *H01L 2227/323* (2013.01)
(58) Field of Classification Search
    CPC ............. H01L 27/3246; H01L 27/3244; H01L 27/3241; H01L 2227/323; H01L 51/5253; H01L 51/56
    See application file for complete search history.

(56) References Cited

U.S. PATENT DOCUMENTS

| | | | |
|---|---|---|---|
| 8,816,579 B2* | 8/2014 | Kim | H01L 51/5218 313/504 |
| 9,911,795 B2* | 3/2018 | Hou | H01L 51/0005 |
| 2006/0238111 A1 | 10/2006 | Shimizu et al. | |

FOREIGN PATENT DOCUMENTS

| | | |
|---|---|---|
| CN | 101689559 A | 3/2010 |
| CN | 102956669 A | 3/2013 |
| CN | 105448953 A | 3/2016 |
| KR | 100784487 B1 | 12/2007 |

OTHER PUBLICATIONS

Chinese Office Action, dated Apr. 15, 2019, for Chinese Application No. 201711249871.7, 13 pages. (with English machine translation).

* cited by examiner

*Primary Examiner* — Andrew Q Tran
(74) *Attorney, Agent, or Firm* — Seed IP Law Group LLP

(57) ABSTRACT

An electroluminescent display device includes a substrate, an electrode on the substrate, a first bank layer for covering an end of the electrode and exposing the electrode, a second bank layer on the first bank layer, and an emission layer on the exposed electrode, wherein the first bank layer includes a first pattern portion for covering the end of the electrode, and a second pattern portion upwardly extending from the first pattern portion.

7 Claims, 7 Drawing Sheets

ELECTROLUMINESCENT DISPLAY DEVICE WITH FLATNESS IMPROVEMENT OF EMISSION LAYER

CROSS REFERENCE TO RELATED APPLICATIONS

This application claims the benefit of the Korean Patent Application No. 10-2016-0181404 filed on Dec. 28, 2016, which is hereby incorporated by reference as if fully set forth herein.

BACKGROUND

Technical Field

Embodiments of the present disclosure relate to an electroluminescent display device, and more particularly, to an electroluminescent display device manufactured by a solution process.

Description of the Related Art

An electroluminescent display device is provided in such way that an emission layer is formed between two electrodes. Accordingly, as the emission layer emits light by an electric field between the two electrodes, an image is displayed on the electroluminescent display device.

The emission layer may be formed of an organic material which emits light when an exciton produced by a bond of electron and hole falls to a ground state from an excited state, or may be formed of an inorganic material such as quantum dot.

Hereinafter, a related art electroluminescent display device will be described with reference to the accompanying drawings.

FIG. 1 is a cross sectional view illustrating a related art electroluminescent display device.

As shown in FIG. 1, the related art electroluminescent display device may include a substrate 10, an electrode 20, a first bank layer 31, a second bank layer 32, and an emission layer 40.

The electrode 20 is provided on the substrate 10.

The first bank layer 31, which covers an end of the electrode 20, is provided on the substrate 10.

The second bank layer 32 is provided on the first bank layer 31. According as a width of the second bank layer 32 is smaller than a width of the first bank layer 31, it is possible to realize a 2-step bank structure by the first bank layer 31 and the second bank layer 32, so that it is possible to improve spreadability of a solution at both sides of the emission layer 40, and to prevent the emission layer 40 from overflowing the second bank layer 32.

The emission layer 40 is provided on the electrode 20. The emission layer 40 may be formed by a solution process using an inkjet apparatus.

However, the related art electroluminescent display device has the following disadvantages.

In case of the related art, it is necessary to pattern the first bank layer 31 so as to realize the 2-step bank structure. In this case, a surface of the electrode 20 may be damaged by an etching solution or etching gas for patterning the first bank layer 31.

For example, if the first bank layer 31 is patterned by a wet etching process, a pin hole may be generated in the surface of the electrode 20 by the etching solution. Also, if the first bank layer 31 is patterned by a dry etching process, foreign matters such as fluorine (F) or sulfur (S) may be generated in the surface of the electrode 20 by the etching gas.

If the emission layer 40 is formed on the electrode 20 whose surface is damaged by the pin hole or the foreign matters, pollutants may be permeated into the emission layer 40 via the pin hole of the electrode 20, or the foreign matters may be permeated into the emission layer 40, to thereby shorten a lifespan of the electroluminescent display device.

BRIEF SUMMARY

Accordingly, embodiments of the present disclosure are directed to an electroluminescent display device that, among others, substantially obviates one or more problems due to limitations and disadvantages of the related art.

An aspect of embodiments of the present disclosure is directed to provide an electroluminescent display device which is capable of extending a lifespan by preventing an electrode from being damaged, and a method for manufacturing the same.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided an electroluminescent display device that may include a substrate, an electrode on the substrate, a first bank layer for covering an end of the electrode and exposing the electrode, a second bank layer on the first bank layer, and an emission layer on the exposed electrode, wherein the first bank layer includes a first pattern portion for covering the end of the electrode, and a second pattern portion upwardly extending from the first pattern portion.

In another aspect of an embodiment of the present disclosure, there is provided a method for manufacturing an electroluminescent display device that may include forming an electrode on a substrate, forming a first photoresist pattern on an entire surface of the substrate including the electrode, and irradiating some portion of the first photoresist pattern with light using a mask, exposing both ends of the electrode and making the first photoresist pattern be remaining on the electrode by developing the first photoresist pattern, forming a first bank layer on the exposed electrode and the remaining first photoresist pattern, forming a second photoresist pattern on the first bank layer, and removing some portion of the first bank layer on the first photoresist pattern and making the remaining portion of the first bank layer be remaining therein with the second photoresist pattern used as a mask, removing the first photoresist pattern on the first electrode, forming a second bank layer on the remaining portion of the first bank layer; and forming an emission layer on the first electrode.

It is to be understood that both the foregoing general description and the following detailed description of embodiments of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
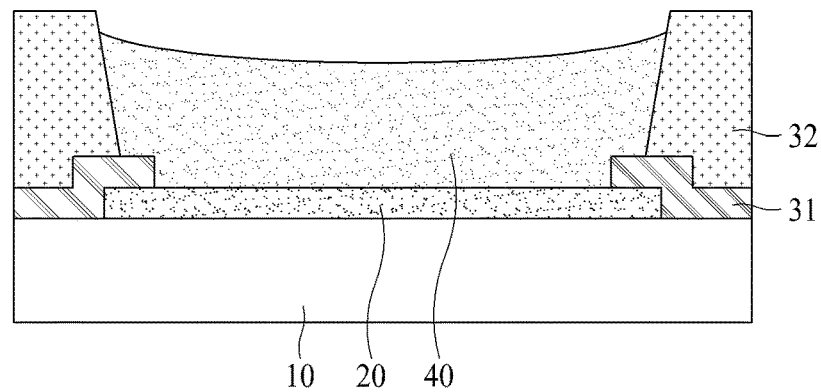
FIG. 1 is a cross sectional view illustrating a related art electroluminescent display device.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise", "have", and "include" described in the present specification are used, another part may be added unless "only~" is used. The terms of a singular form may include plural forms unless referred to the contrary.

In construing an element, the element is construed as including an error region although there is no explicit description.

In describing a position relationship, for example, when the positional order is described as "on~", "above~", "below~", and "next~", a case which is not contact may be included unless "just" or "direct" is used.

In describing a time relationship, for example, when the temporal order is described as "after~", "subsequent~", "next~", and "before~", a case which is not continuous may be included unless "just" or "direct" is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an electroluminescent display device according to the embodiment of the present disclosure will be described with reference to the accompanying drawings.

FIGS. 2A to 2I are cross sectional views illustrating a method for manufacturing an electroluminescent display device according to one embodiment of the present disclosure.

Figure 2A:
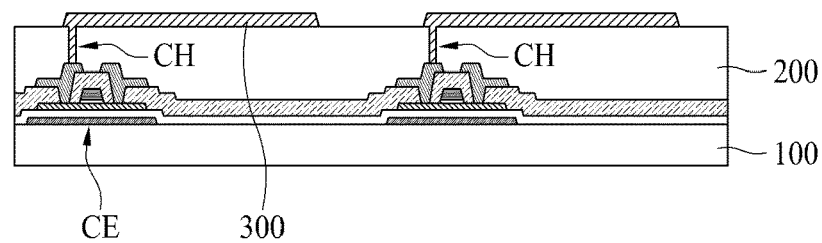
FIGS. 2A to 2I are cross sectional views illustrating a method for manufacturing an electroluminescent display device according to one embodiment of the present disclosure.

First, as shown in FIG. 2A, a circuit device layer 200 is formed on a substrate 100, and an electrode 300 is formed on the circuit device layer 200.

The circuit device layer 200 includes a circuit device (CE). The circuit device (CE) may include a thin film transistor and a capacitor provided by each sub pixel. The thin film transistor may include a switching thin film transistor, a driving thin film transistor, and a sensing thin film transistor. The circuit device (CE) shown in the drawings corresponds to the driving thin film transistor. The circuit device layer 200 may be formed in various shapes and various processes generally known to those in the art.

The electrode 300 may be patterned for each sub pixel. The electrode 300 is electrically connected with the circuit device (CE) of the circuit device layer 200. The electrode 300 may function as an anode of the electroluminescent display device. If the electroluminescent display device according to the embodiment of the present disclosure is a top emission type, the electrode 300 serves as a reflective electrode. Meanwhile, if the electroluminescent display device according to the embodiment of the present disclosure is a bottom emission type, the electrode 300 serves as a transparent electrode.

Figure 2B:
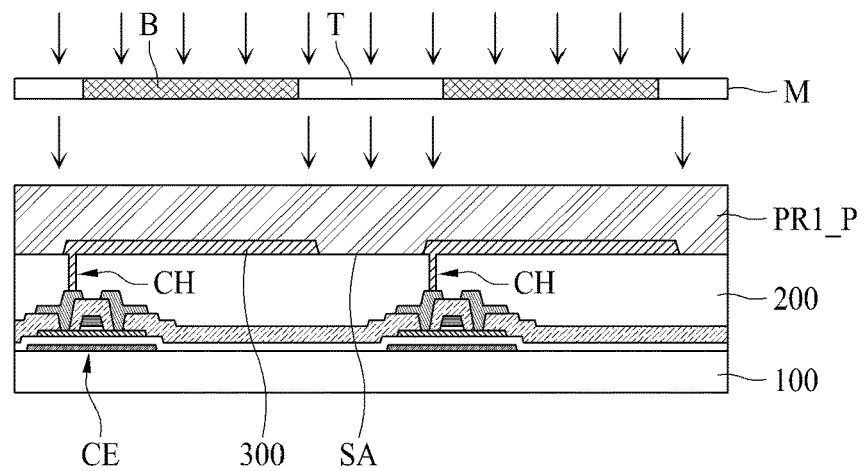

As shown in FIG. 2B, a first photoresist pattern (PR1_P) of a positive type is formed on an entire surface of the substrate 100 including the circuit device layer 200 and the electrode 300, and then the first photoresist pattern (PR1_P) is irradiated with light using a mask (M).

In a case that the first photoresist pattern (PR1_P) is of the positive type, a predetermined portion irradiated with light has a chemical reaction, and the predetermined portion having the chemical reaction is removed by a developing solution. Accordingly, some portion of the first photoresist pattern (PR1_P) of the positive type is irradiated with light, and the remaining portion thereof is not irradiated with light, whereby the portion irradiated with light is removed by the developing solution, and the remaining portion which is not irradiated with light remains without being removed by the developing solution.

The mask (M) includes a light-blocking portion (B) and a light-transmitting portion (T). Accordingly, if the first photoresist pattern (PR1_P) is irradiated with light using the mask (M), some portion of the first photoresist pattern (PR1_P) corresponding to the light-transmitting portion (T) is irradiated with light, and the remaining portion of the first photoresist pattern (PR1_P) corresponding to the light-blocking portion (B) is not irradiated with light.

The light-transmitting portion (T) of the mask (M) overlap a spacing area (SA) between each of the electrodes 300 patterned for each sub pixel, and two opposing ends 302 of the electrode 300, and the light-blocking portion (B) of the mask (M) overlap the remaining portion of the electrode 300 except the opposing ends 302 of the electrode 300, and does not overlap the spacing area SA between each of the electrodes 300.

Figure 2C:
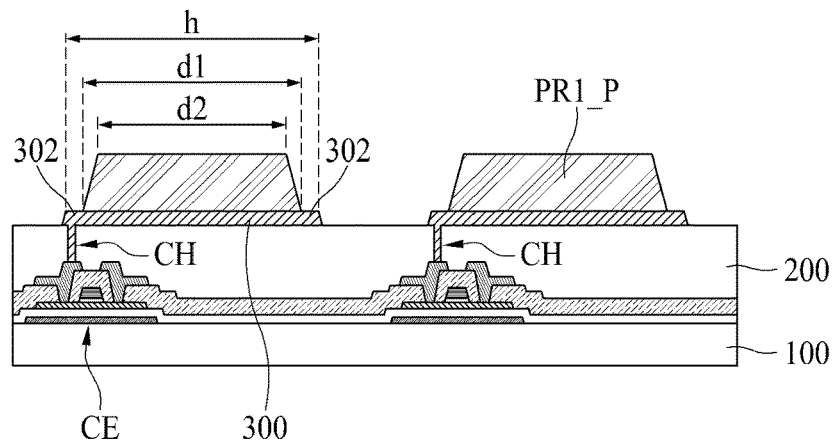

Then, as shown in FIG. 2C, the first photoresist pattern (PR1_P) is developed, whereby some portion of the first photoresist pattern (PR1_P) corresponding to the light-transmitting portion (T) of the mask (M) is removed, and the remaining portion of the first photoresist pattern (PR1_P) corresponding to the light-blocking portion (B) of the mask (M) remains.

A width (d1, d2) of the remaining first photoresist pattern (PR1_P) is smaller than a width (h) of the electrode 300. Thus, the two opposing ends 302 of the electrode 300 are not covered by the remaining first photoresist pattern (PR1_P), and are exposed to the outside.

In this case, a width (d1) in a lower surface of the remaining first photoresist pattern (PR1_P) is larger than a width (d2) in an upper surface of the remaining first photoresist pattern (PR1_P). For the aforementioned process of FIG. 2B, the upper surface of the first photoresist pattern (PR1_P) is irradiated with light, whereby an amount of light irradiation in the upper surface of the first photoresist pattern (PR1_P) is relatively larger than an amount of light irradiation in the lower surface of the first photoresist pattern (PR1_P). Accordingly, an amount of removal in the upper surface of the first photoresist pattern (PR1_P) is relatively larger than an amount of removal in the lower surface of the first photoresist pattern (PR1_P) for the developing process. For this reason, the width (d1) in the lower surface of the first photoresist pattern (PR1_P) remaining after the developing process is relatively larger than the width (d2) in the upper surface of the first photoresist pattern (PR1_P).

Figure 2D:
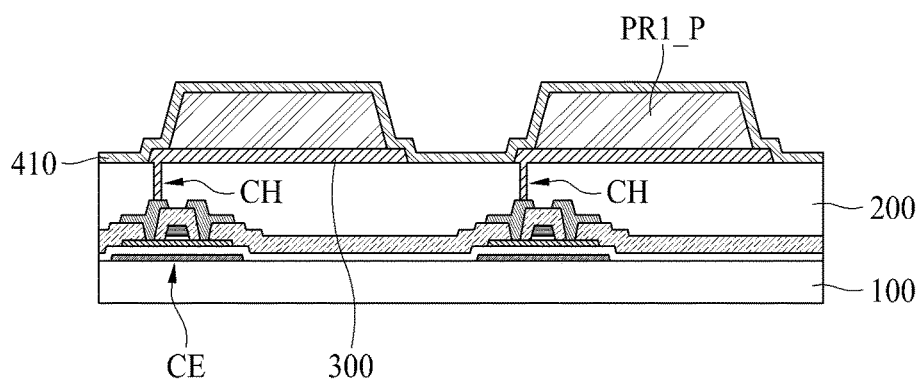

Then, as shown in FIG. 2D, a first bank layer 410 is formed on the circuit device layer 200, the electrode 300 which is not covered by the first photoresist pattern (PR1_P) and is exposed to the outside, and the first photoresist pattern (PR1_P).

The first bank layer 410 may be formed of an inorganic insulating material having the hydrophilic properties, for example, silicon oxide by a chemical vapor deposition (CVD) process.

In this case, a portion of the electrode 300 corresponding to a light-emission portion is covered by the first photoresist pattern (PR1_P), whereby it is possible to protect the portion of the electrode 300 corresponding to the light-emission portion in the CVD process of forming the first bank layer 410. In consideration of the heat-resisting properties of the first photoresist pattern (PR1_P), the CVD process is carried out at a temperature below 230° C. preferably.

Meanwhile, the first bank layer 410 is formed on upper and lateral surfaces of the first photoresist pattern (PR1_P).

Figure 2E:
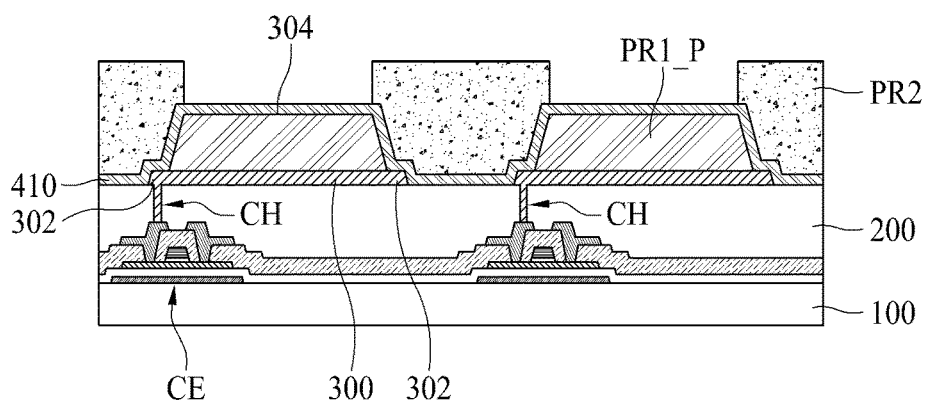

Then, as shown in FIG. 2E, a second photoresist pattern (PR2) is formed on the first bank layer 410. The second photoresist pattern overlaps the opposing ends 302 of the electrode and exposes a portion of the first bank layer 410 on the remaining first photoresist pattern (PR1_P).

The second photoresist pattern (PR2) functions as a mask for the process of patterning the first bank layer 410. Thus, the second photoresist pattern (PR2) is provided in such a way that the first bank layer 410 above the first photoresist pattern (PR1_P) is exposed to the outside. That is, the second photoresist pattern (PR2) is not formed above an upper surface 304 of the first photoresist pattern (PR1_P).

Figure 2F:
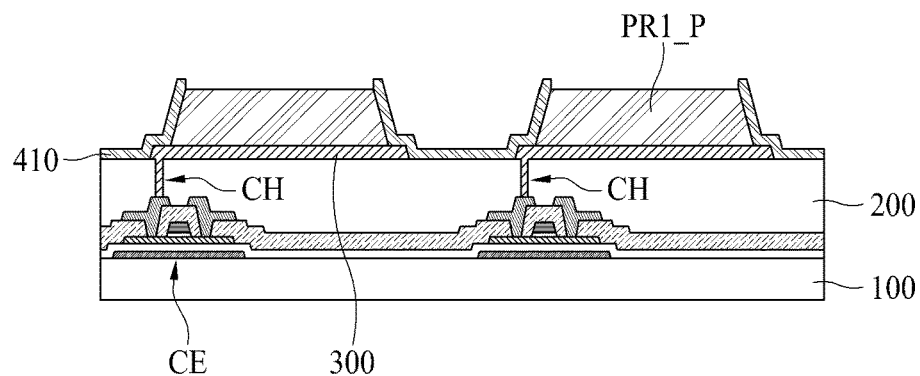

As shown in FIG. 2F, the exposed first bank layer 410 is removed under the condition the second photoresist pattern (PR2) is used as a mask.

The process of removing the exposed first bank layer 410 may be carried out by a wet etching process or a dry etching process. As the first photoresist pattern (PR1_P) is provided below the first bank layer 410 to be removed, the first photoresist pattern (PR1_P) protects the electrode 300 for the process of removing the exposed first bank layer 410.

Figure 2G:
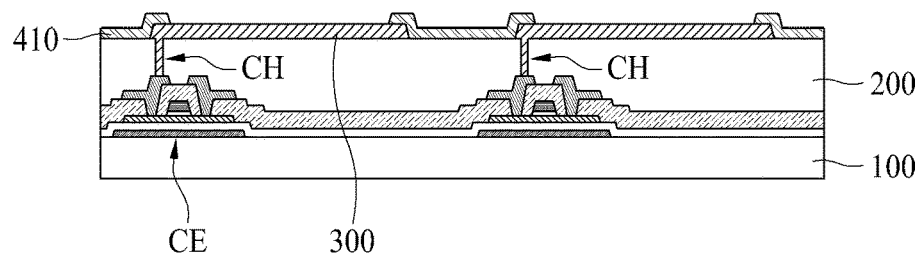

Then, as shown in FIG. 2G, the first photoresist pattern (PR1_P) is removed. In this case, the first bank layer 410 provided on the lateral surface of the first photoresist pattern (PR1_P) may be removed in the process of removing the first photoresist pattern (PR1_P).

As described above in FIG. 2C, the width (d1) in the lower surface of the first photoresist pattern (PR1_P) is larger than the width (d2) in the upper surface of the first photoresist pattern (PR1_P), whereby the first bank layer 410 provided on the lateral surface of the first photoresist pattern (PR1_P) is removed for the process of removing the first photoresist pattern (PR1_P) in an upper direction.

After removing the first photoresist pattern (PR1_P), the remaining first bank layer 410 extends from the circuit device layer 200 to the end 302 of the electrode 300, to thereby cover the end 302 of the electrode 300.

Figure 2H:
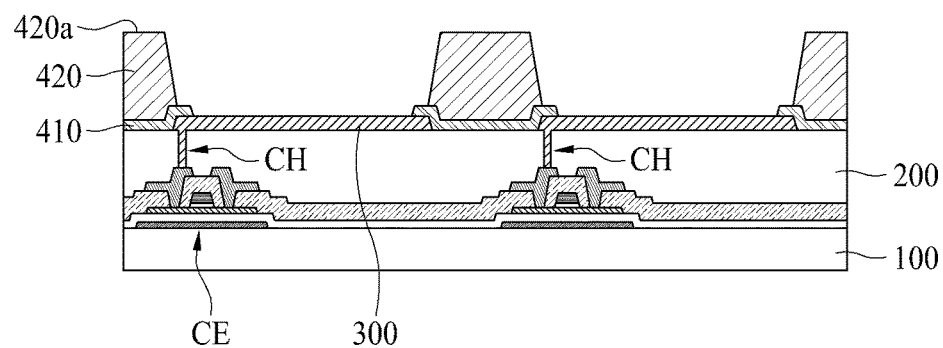

Then, as shown in FIG. 2H, a second bank layer 420 is formed on the remaining first bank layer 410.

A width of the second bank layer 420 is smaller than a width of the first bank layer 410. The second bank layer 420 may be patterned by coating a mixture solution of an organic insulating material having the hydrophilic properties and a hydrophobic material such as fluorine (F), and carrying out a photolithography process. By light irradiated for the photolithography process, the hydrophobic material such as fluorine (F) may be transferred to an upper portion 420a of the second bank layer 420, whereby the upper portion 420 of the second bank layer 420 has the hydrophobic properties, and the remaining portions of the second bank layer 420 have the hydrophilic properties. However, it is possible to provide the second bank layer 420 with an entire portion having the hydrophobic properties.

Figure 2I:
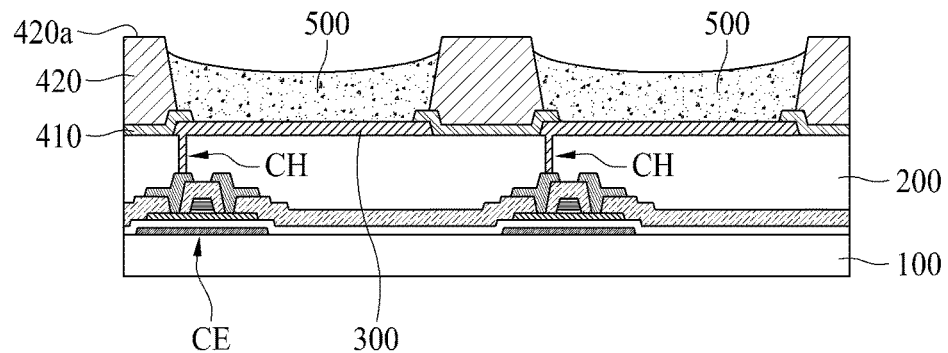

Then, as shown in FIG. 2I, an emission layer 500 is formed on the electrode 300. The emission layer 500 is formed by a solution process using an inkjet apparatus. The emission layer 500 is not provided over the upper portion 420a of the second bank layer 420 having the hydrophobic properties.

The emission layer 500 formed by the solution process may include at least one organic layer among a hole injecting layer, a hole transporting layer, an emitting layer, an electron transporting layer, and an electron injecting layer. If needed, the emission layer 500 may be formed of an inorganic material such as quantum dot.

For example, the emission layer 500 may be formed in a sequential deposition structure of the hole injecting layer, the hole transporting layer, the emitting layer, the electron transporting layer, and the electron injecting layer.

If needed, the emission layer 500 may be formed in a sequential deposition structure of the hole injecting layer, the hole transporting layer, and the emitting layer. In this case, the electron transporting layer and the electron injecting layer may be additionally deposited on the emission layer 500 by a deposition process such as evaporation. Although not shown, the electron transporting layer and the electron injecting layer, which are provided by the deposition process, are not individually patterned by each sub pixel, and the electron transporting layer and the electron injecting layer are provided not only on the emission layer 500 but also on the second bank layer 420.

Although not shown, a cathode may be additionally provided on the emission layer 500 and the second bank layer 420. If the electroluminescent display device according to the present disclosure is a top emission type, the cathode serves as a transparent electrode. Meanwhile, if the electroluminescent display device according to the present disclosure is a bottom emission type, the cathode serves as a reflective electrode.

According to one embodiment of the present disclosure, the first photoresist pattern (PR1_P) of the positive type is formed on the electrode 300, and then the first bank layer 410 is patterned thereon. Thus, it is possible to protect the electrode 300 by the use of first photoresist pattern (PR1_P) in the deposition process of the first bank layer 410 and the etching process of removing some portion of the first bank layer 410, to thereby prevent the surface of the electrode 300 from being damaged.

FIGS. 3A to 3I are cross-sectional views illustrating a method for manufacturing an electroluminescent display device according to another embodiment of the present disclosure.

Figure 3A:
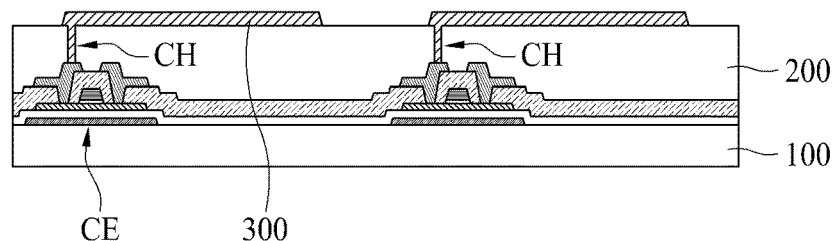
FIGS. 3A to 3I are cross sectional views illustrating a method for manufacturing an electroluminescent display device according to another embodiment of the present disclosure.

First, as shown in FIG. 3A, a circuit device layer 200 is formed on a substrate 100, and an electrode 300 is formed on the circuit device layer 200.

The circuit device layer 200 and the electrode 300 shown in the electroluminescent display device according to another embodiment of the present disclosure are the same as those shown in the above electroluminescent display device according to one embodiment of the present disclosure, whereby a detailed description for the circuit device layer 200 and the electrode 300 will be omitted.

Figure 3B:
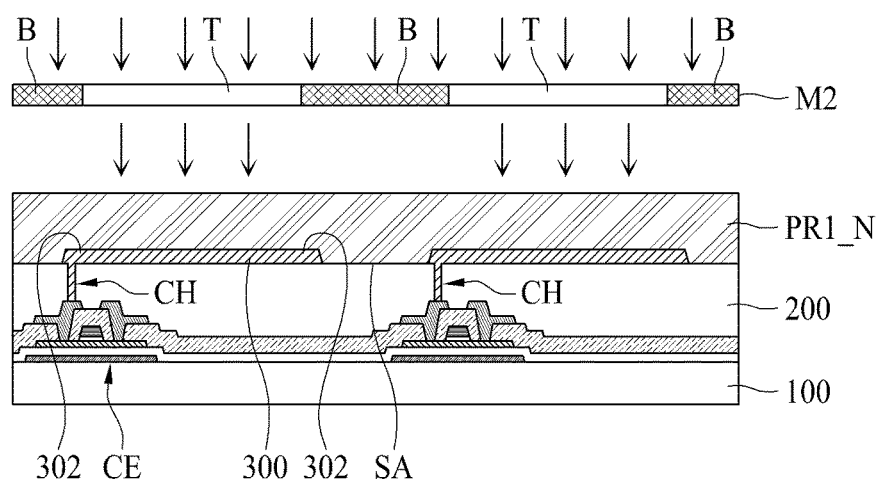

Then, as shown in FIG. 3B, a first photoresist pattern (PR1_N) of a negative type is formed on the circuit device layer 200 and the electrode 300, and then the first photoresist pattern (PR1_N) is irradiated with light using a mask (M2).

In case of the first photoresist pattern (PR1_N) of the negative type, a predetermined portion irradiated with light has a chemical reaction, and the predetermined portion having the chemical reaction is not removed by a developing solution. Accordingly, some portion of the first photoresist pattern (PR1_N) of the negative type is irradiated with light, and the remaining portion thereof is not irradiated with light, whereby the portion irradiated with light remains without being removed by the developing solution, and the remaining portion which is not irradiated with light is removed by the developing solution.

The mask (M) includes a light-blocking portion (B) and a light-transmitting portion (T). Accordingly, if the first photoresist pattern (PR1_N) is irradiated with light using mask (M2), some portion of the first photoresist pattern (PR1_N) corresponding to the light-transmitting portion (T) is irradiated with light, and the remaining portion of the first photoresist pattern (PR1_N) corresponding to the light-blocking portion (B) is not irradiated with light.

The light-blocking portion (B) of the mask (M2) overlaps a spacing area (SA) between each of the electrodes 300 patterned for each sub pixel, and opposing ends 302 of the electrode 300, and the light-transmitting portion (T) of the mask (M2) overlaps the remaining portion of the electrode 300 except the opposing ends 302 of the electrode 300, and does not overlap the spacing area (SA) between each of the electrodes 300.

Figure 3C:
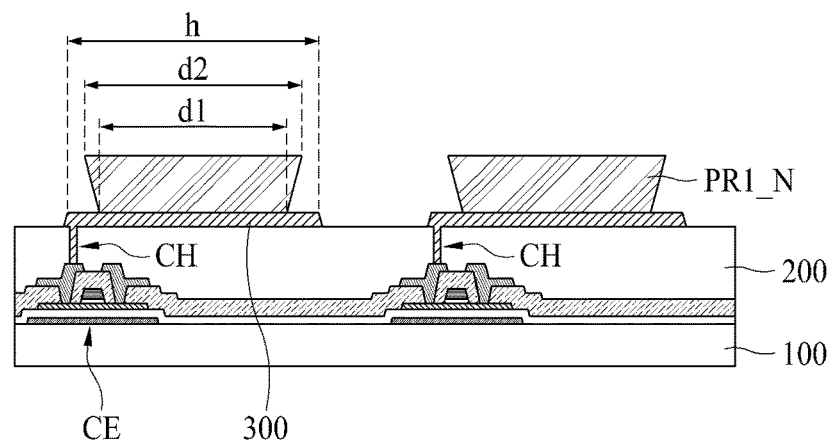

Then, as shown in FIG. 3C, the first photoresist pattern (PR1_N) is developed, whereby some portion of the first photoresist pattern (PR1_N) corresponding to the light-transmitting portion (T) of the mask (M2) remains without being removed, and the remaining portion of the first photoresist pattern (PR1_N) corresponding to the light-blocking portion (B) of the mask (M2) is removed.

A width (d1, d2) of the remaining first photoresist pattern (PR1_N) is smaller than a width (h) of the electrode 300. Thus, two opposing ends 302 of the electrode 300 are not covered by the remaining first photoresist pattern (PR1_N), and are exposed to the outside.

In this case, a width (d1) in a lower surface of the remaining first photoresist pattern (PR1_N) is smaller than a width (d2) in an upper surface of the remaining first photoresist pattern (PR1_N). For the aforementioned process of FIG. 3B, the upper surface of the first photoresist pattern (PR1_N) is irradiated with light, whereby an amount of light irradiation in the upper surface of the first photoresist pattern (PR1_N) is relatively larger than an amount of light irradiation in the lower surface of the first photoresist pattern (PR1_N). Accordingly, an amount of removal in the upper surface of the first photoresist pattern (PR1_N) is relatively smaller than an amount of removal in the lower surface of the first photoresist pattern (PR1_N) for the developing process. For this reason, the width (d1) in the lower surface of the first photoresist pattern (PR1_N) remaining after the developing process is relatively smaller than the width (d2) in the upper surface of the first photoresist pattern (PR1_N).

Figure 3D:
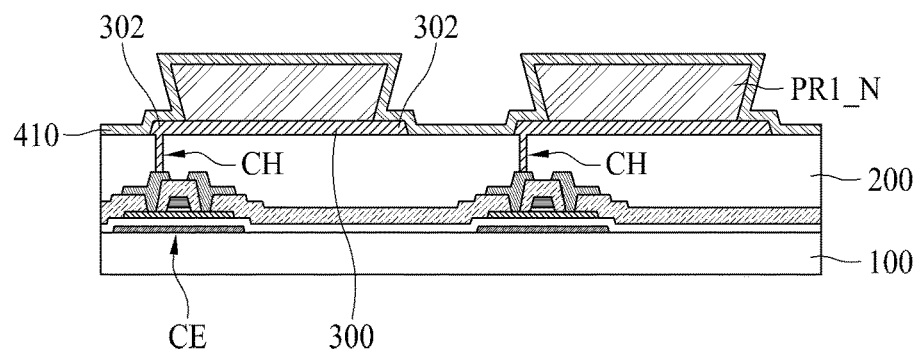

Then, as shown in FIG. 3D, a first bank layer 410 is formed on the circuit device layer 200, the electrode 300 which is not covered by the first photoresist pattern (PR1_N) and is exposed to the outside, namely the opposing ends 302 of the electrode 300, and the first photoresist pattern (PR1_N).

The first bank layer 410 may be formed of an inorganic insulating material having the hydrophilic properties, for example, silicon oxide by a chemical vapor deposition (CVD) process, as described above. The first bank layer 410 may be formed at a temperature below 230° C.

In this case, a portion of the electrode 300 corresponding to a light-emission portion is covered by the first photoresist pattern (PR1_N), whereby it is possible to protect the portion of the electrode 300 corresponding to the light-emission portion for the CVD process of forming the first bank layer 410.

Meanwhile, the first bank layer 410 is formed on upper and lateral surfaces of the first photoresist pattern (PR1_N).

Figure 3E:
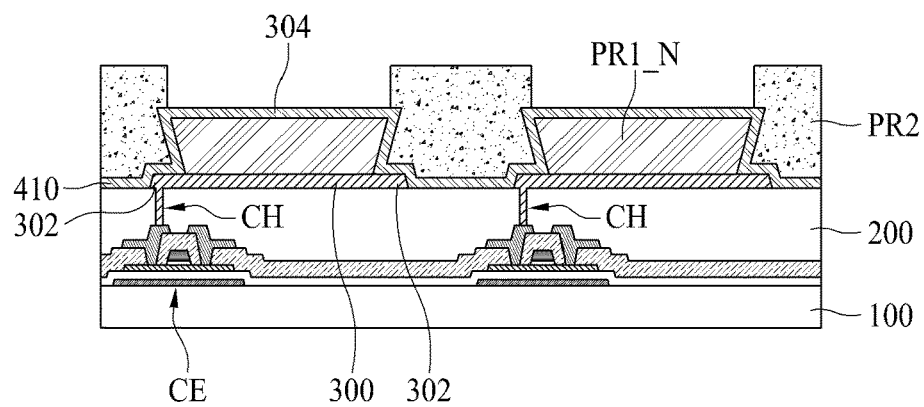

Then, as shown in FIG. 3E, a second photoresist pattern (PR2) is formed on the first bank layer 410. The second photoresist pattern overlaps the opposing ends 302 of the electrode and expose a portion of the first bank layer 410 on the remaining first photoresist pattern (PR1_N)

In the same manner as the aforementioned embodiment of the present disclosure, the second photoresist pattern (PR2) functions as a mask for the process of patterning the first bank layer 410. Thus, the second photoresist pattern (PR2) is provided in such a way that the first bank layer 410 above the first photoresist pattern (PR1_N) is exposed to the outside. That is, the second photoresist pattern (PR2) is not formed over an upper surface 304 of the first photoresist pattern (PR1_N).

Figure 3F:
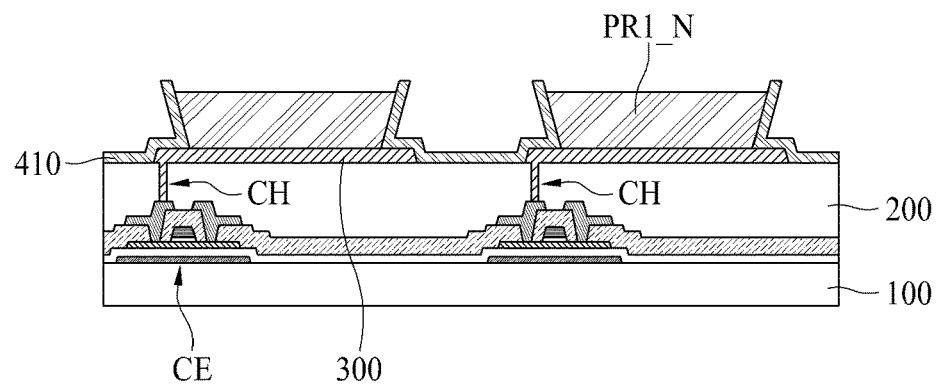

As shown in FIG. 3F, the exposed first bank layer 410 is removed with the second photoresist pattern (PR2) used as a mask.

In the same manner as the aforementioned embodiment of the present disclosure, the process of removing the exposed first bank layer 410 may be carried out by a wet etching process or a dry etching process.

Figure 3G:
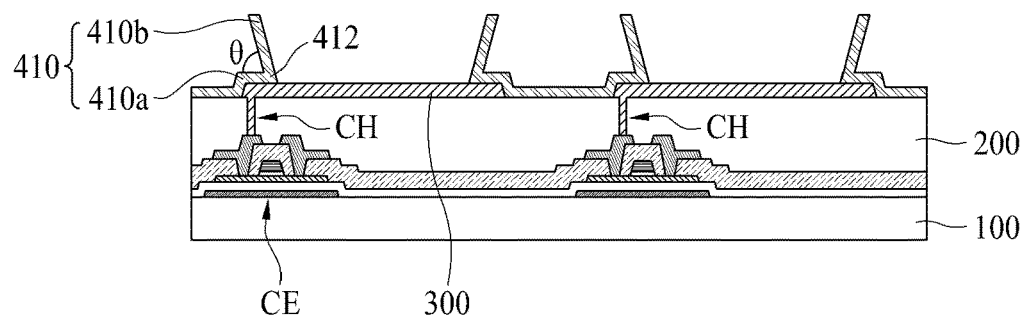

Then, as shown in FIG. 3G, the first photoresist pattern (PR1_N) is removed. In this case, the first bank layer 410 provided on the lateral surface of the first photoresist pattern (PR1_N) remains in the process of removing the first photoresist pattern (PR1_N).

As described above in FIG. 3C, the width (d1) in the lower surface of the first photoresist pattern (PR1_N) is smaller than the width (d2) in the upper surface of the first photoresist pattern (PR1_N), whereby the first bank layer 410 provided on the lateral surface of the first photoresist pattern (PR1_N) remains for the process of removing the first photoresist pattern (PR1_N) in an upper direction.

After removing the first photoresist pattern (PR1_P), the remaining first bank layer 410 extends from the circuit device layer 200 to the end of the electrode 300, whereby the first bank layer 410 includes a first pattern portion 410a covering the end of the electrode 300, and a second pattern portion 410b upwardly extending from an end 412 of the first pattern portion 410a.

In this case, an angle (θ) between the first pattern portion 410a and the second pattern portion 410b is less than 90°.

Figure 3H:
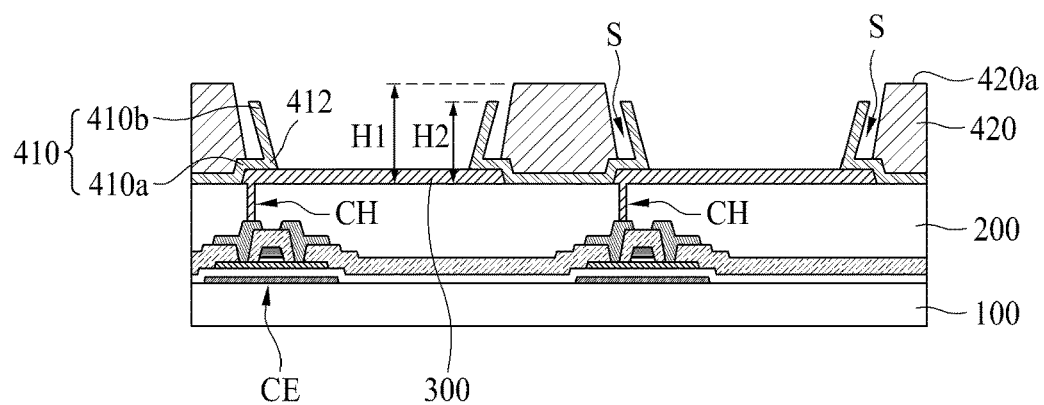

Then, as shown in FIG. 3H, a second bank layer 420 is formed on the first bank layer 410.

In the same manner as the aforementioned embodiment of the present disclosure, a width of the second bank layer 420 is smaller than a width of the first bank layer 410. Herein, an upper portion 420 of the second bank layer 420 has the hydrophobic properties, and the remaining portions of the second bank layer 420 have the hydrophilic properties. However, it is possible to provide the second bank layer 420 with an entire portion having the hydrophobic properties.

In this case, the second bank layer 420 may be provided in such a way that the second bank layer 420 is not in contact with the second pattern portion 410b of the first bank layer 410, whereby a well-shaped space (S) may be prepared between the second bank layer 420 and the second pattern portion 410b of the first bank layer 410. In an example, a height H1 of the second bank layer 420 at an upper surface thereof is higher than a height H2 of an adjacent second pattern portion 410b at the upper surface thereof.

Figure 3I:
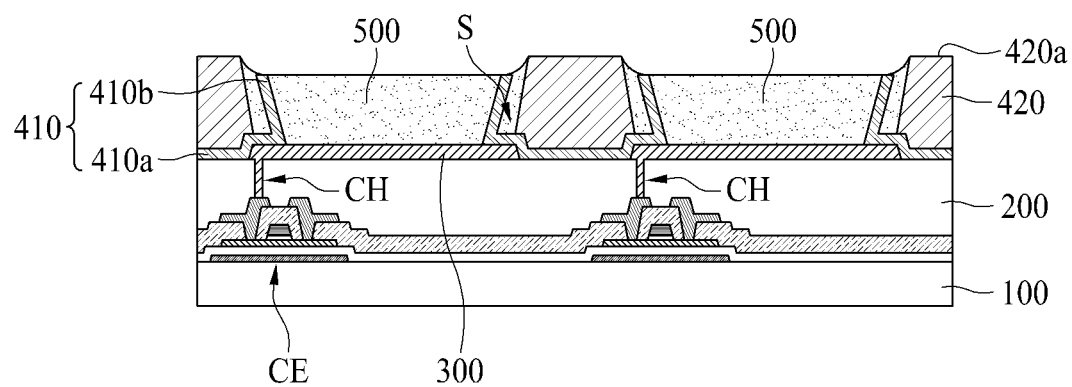

Then, as shown in FIG. 3I, an emission layer 500 is formed on the electrode 300.

In the same manner as the aforementioned embodiment of the present disclosure, the emission layer 500 is formed by a solution process using an inkjet apparatus. The emission layer 500 is the same as that of the aforementioned embodiment, whereby a detailed description for the emission layer 500 will be omitted.

Meanwhile, the emission layer 500 is provided in the space (S) between the second bank layer 420 and the second pattern portion 410b of the first bank layer 410. Accordingly, it is possible to improve flatness of the emission layer 500 provided on the electrode 300. That is, the space (S) between the second bank layer 420 and the second pattern portion 410b of the first bank layer 410 serves as a buffering area so that it is possible to improve flatness of the emission layer 500 formed on the remaining area except the space (S), that is, the electrode 300.

In the same manner as the aforementioned embodiment of the present disclosure, although not shown, a cathode may be additionally provided on the emission layer 500 and the second bank layer 420.

According to another embodiment of the present disclosure, the first photoresist pattern (PR1_N) of the negative type is formed on the electrode 300, and then the first bank layer 410 is patterned thereon. Thus, it is possible to protect the electrode 300 by the use of first photoresist pattern (PR1_N) for the deposition process of the first bank layer 410 and the etching process of removing some portion of the first bank layer 410, to thereby prevent the surface of the electrode 300 from being damaged.

According to another embodiment of the present disclosure, the first photoresist pattern (PR1_N) of the negative type is formed on the electrode 300, and then the first bank layer 410 is patterned thereon, whereby the first bank layer 410 is provided with the first pattern portion 410a for covering the end 302 of the electrode 300, and the second pattern portion 410b upwardly extending from an end of the first pattern portion 410a that covers the end of the electrode 300. Accordingly, the space (S) serving as the buffering area is prepared between the second bank layer 420 and the second pattern portion 410b of the first bank layer 410, so that it is possible to improve flatness of the emission layer 500 in the light-emission area (EA).

Figure 4:
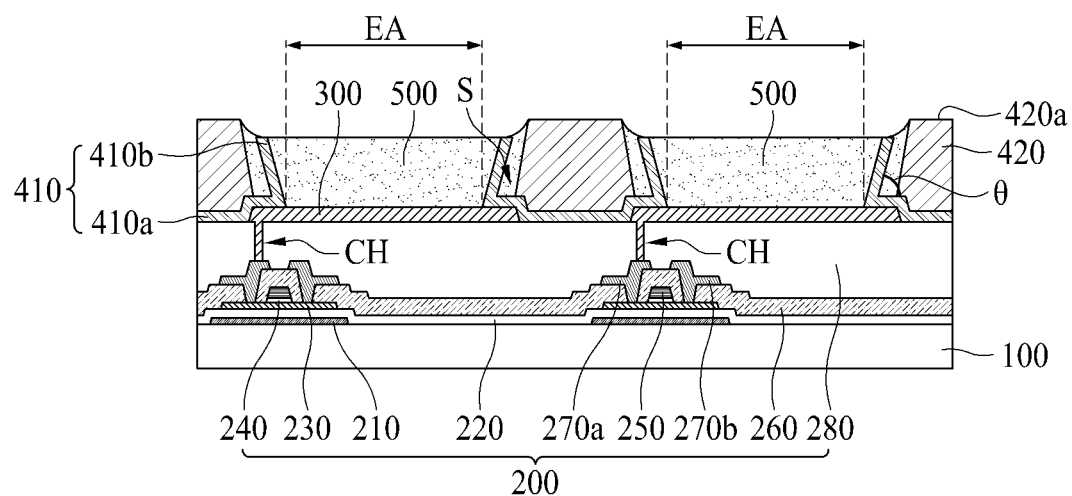
FIG. 4 is a cross sectional view illustrating an electroluminescent display device according to one embodiment of the present disclosure.

FIG. 4 is a cross sectional view illustrating an electroluminescent display device according to one embodiment of the present disclosure, which relates to the electroluminescent display device manufactured by the above manufacturing process of FIGS. 3A to 3I.

As shown in FIG. 4, the electroluminescent display device according to one embodiment of the present disclosure includes the substrate 100, the circuit device layer 200, the electrode 300, the first bank layer 410, the second bank layer 420, and the emission layer 500.

The substrate 100 may be formed of glass or transparent plastic, but not limited to these materials.

The circuit device layer 200 is formed on the substrate 100.

The circuit device layer 200 may include a light-shielding layer 210, a buffer layer 220, an active layer 230, a gate insulating film 240, a gate electrode 250, an insulating interlayer 260, a source electrode 270a, a drain electrode 270b, and a planarization layer 280.

The light-shielding layer 210 is formed on the substrate 100, to prevent light from being advanced to the active layer 230. Thus, the light-shielding layer 210 is overlapped with the active layer 230, and an area of the light-shielding layer 210 is larger than an area of the active layer 230.

The buffer layer 220 is formed on the light-shielding layer 210, to thereby insulate the light-shielding layer 210 and the active layer 230 from each other. Also, the buffer layer 220 prevents a material contained in the substrate 100 from spreading to an upper portion.

The active layer 230 is formed on the buffer layer 220. The active layer 230 may be formed of a silicon-based semiconductor material or an oxide-based semiconductor material, but not limited to these materials.

The gate insulating film 240 is formed on the active layer 230, to thereby insulate the active layer 230 and the gate electrode 250 from each other.

The gate electrode 250 is formed on the gate insulating film 240.

The insulating interlayer 260 is formed on the gate electrode 250, to thereby insulate the gate electrode 250 from the source/drain electrodes 270a/270b.

The source electrode 270a and the drain electrode 270b facing each other are provided on the insulating interlayer 260 and are provided at a predetermined interval from each other. The source electrode 270a and the drain electrode 270b are respectively connected with one end and the other end of the active layer 230 via contact holes CH provided in the insulating interlayer 260.

The planarization layer 280 is formed on the source electrode 270a and the drain electrode 270b, to thereby planarize a surface of the substrate 100.

The circuit device layer 200 may include a thin film transistor having the gate electrode 250, the active layer 230, the source electrode 270a, and the drain electrode 270b. FIG. 4 shows the thin film transistor with a top gate structure where the gate electrode 250 is provided on the active layer 230, but not limited to this structure. The circuit device layer 200 may include the thin film transistor with a bottom gate structure where the gate electrode 250 is provided below the active layer 230.

The circuit device layer 200 may include a switching thin film transistor, a driving thin film transistor, a sensing thin film transistor, and a capacitor. The thin film transistor shown in FIG. 4 corresponds to the driving thin film transistor.

The thin film transistor and the capacitor included in the circuit device layer 200 may be formed below the emission layer 500, or may be formed below the bank layer 410 and 420. For example, in case of a top emission type of the electroluminescent display device according to the embodiment of the present disclosure, even though the thin film transistor and the capacitor are disposed below the emission layer 500, a light emission is not influenced by the thin film transistor and the capacitor, whereby the thin film transistor and the capacitor may be disposed below the emission layer 500. In case of a bottom emission type of the electroluminescent display device according to the embodiment of the present disclosure, if the thin film transistor and the capacitor are disposed below the emission layer 500, a light emission may be influenced by the thin film transistor and the capacitor, whereby the thin film transistor and the capacitor may be disposed below the bank layer 410 and 420.

The electrode 300 is formed on the circuit device layer 200. The electrode 300 may function as an anode of the electroluminescent display device. If the electroluminescent display device according to the present disclosure is a bottom emission type, the electrode 300 serves as a transparent electrode. Meanwhile, if the electroluminescent display device according to the present disclosure is a top emission type, the electrode 300 serves as a reflective electrode. For example, the electrode 300 may be formed of a transparent conductive material such as Indium Tin oxide (ITO), or may be formed in a dual-layered structure of a reflective layer of argentums (Ag) and a transparent conductive layer of Indium Tin Oxide (ITO), but not limited to this structure.

The electrode 300 may be connected with the source electrode 270a of the circuit device layer 200 via the contact hole CH provided in the planarization layer 280, but not limited to this structure. If needed, the electrode 300 may be connected with the drain electrode 270b of the circuit device layer 200 via the contact hole CH provided in the planarization layer 280.

The first bank layer 410 is formed on the circuit device layer 200. The first bank layer 410 covers both ends 302 of the electrode 300, and exposes a surface of the electrode 300. That is, the first bank layer 410 is in contact with the electrode 300 and some area of the circuit device layer 200.

A thickness of the first bank layer 410 is smaller than a thickness of the second bank layer 420, and a width of the first bank layer 410 is larger than a width of the second bank layer 420.

The first bank layer 410 with this structure has the same properties as that of the emission layer 500, that is, the hydrophilic properties. The first bank layer 410 having the hydrophilic properties may be formed of an inorganic insulating material such as silicon oxide. Accordingly, when coating the solution for the emission layer 500, the solution easily spreads on the first bank layer 410.

The first bank layer 410 includes a first pattern portion 410a extending from the circuit device layer 200 to the end of the electrode 300 for covering the end of the electrode 300, and a second pattern portion 410b upwardly extending from the end of the first pattern portion 410a. In this case, the angle ($\theta$) between the first pattern portion 410a and the second pattern portion 410b is less than 90°. Thus, the solution for the emission layer 500 easily spreads to the second bank layer 420 along the second pattern portion 410b. The second pattern portion 410B upwardly extends from the first pattern portion to a height H2 greater than a thickness of the first pattern portion 410a. In an embodiment, height H2 is three times greater than the thickness of the first pattern portion 410a.

The second bank layer 420 is patterned on the first bank layer 410.

The width of the second bank layer 420 is smaller than the width of the first bank layer 410. The upper portion 420a of the second bank layer 420 has the hydrophobic properties, and the other portions of the second bank layer 420 except the upper portion 420a have the hydrophilic properties, but not limited to this structure. For example, the entire portions of the second bank layer 420 may have the hydrophobic properties.

The spreadability of the solution for the emission layer 500 may be improved by the first bank layer 410 and the predetermined portions of the second bank layer 420 which have the hydrophilic properties.

Also, the upper portion 420a of the second bank layer 420, which has the hydrophobic properties, prevents the solution for the emission layer 500 from spreading to the adjoining sub pixels so that it is possible to prevent the emission layer 500 from being mixed together in the adjoining sub pixels.

Accordingly, the bank layer 410 and 420 may be provided along the boundaries between the adjoining sub pixels. Accordingly, it is possible to form an entire matrix configuration by the bank layer 410 and 420, and to prepare the light-emission area in each of the sub pixels by the use of bank layer 410 and 420.

The second bank layer 420 may be provided in such a way that the second bank layer 420 is not in contact with the second pattern portion 410b of the first bank layer 410, whereby the well-shaped space (S) may be prepared between the second bank layer 420 and the second pattern portion 410b of the first bank layer 410.

The well-shaped space (S) serves as the buffering area when the solution for the emission layer 500 spreads, whereby it is possible to prevent the emission layer 500 from being upwardly rolled at the end of the light-emission area (EA) due to its large thickness, to thereby improve flatness of the emission layer 500 in the light-emission area (EA). That is, it is possible to improve uniformity of thickness in the emission layer 500 between each end of the first pattern portions 410a of the respective first bank layers 410 being opposite to each other in each light-emission area (EA).

The emission layer 500 is formed on the electrode 300. The emission layer 500 is formed in the light-emission area (EA), and also formed in the well-shaped space (S) between the second bank layer 420 and the second pattern portion 410b of the first bank layer 410.

The emission layer 500 may be provided to emit red light (R), green light (G), or blue light (B), but not limited to these colors.

As described above, the emission layer 500 may include at least one organic layer among the hole injecting layer, the hole transporting layer, the emitting layer, the electron transporting layer, and the electron injecting layer.

Although not shown, the cathode may be additionally provided on the emission layer 500 and the second bank layer 420. If the electroluminescent display device according to the present disclosure is the top emission type, the cathode electrode serves as the transparent electrode. Meanwhile, if the electroluminescent display device according to the present disclosure is the bottom emission type, the cathode electrode serves as the reflective electrode.

According to one embodiment of the present disclosure, the first bank layer 410 is patterned after forming the first photoresist pattern on the electrode 300, so that it is possible to protect the electrode 300 by the first photoresist pattern for the deposition process of the first bank layer 410 and the etching process of removing some portion of the first bank layer 410, to thereby prevent the surface of the electrode 300 from being damaged.

According to another embodiment of the present disclosure, the first bank layer 410 is patterned after forming the first photoresist pattern of the negative type on the electrode 300, whereby the first bank layer 410 is provided with the first pattern portion 410a for covering the end of the electrode 300, and the second pattern portion 410b upwardly extending from the end of the first pattern portion 410a. Accordingly, it is possible to prepare the space serving as the buffering area between the second bank layer 420 and the second pattern portion 410b of the first bank layer 410, to thereby improve flatness of the emission layer 500 in the light-emission area (EA).

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescent display device comprising:
a substrate;
an electrode on the substrate;
a first bank layer partially covering an end of the electrode and a partially uncovered portion of the electrode forming an exposed portion of the electrode;
a second bank layer on the first bank layer; and
a light-emission layer on the exposed portion of the electrode,
wherein the first bank layer includes a first pattern portion covering a side surface and an upper surface of the end of the electrode, and a second pattern portion upwardly extending from the first pattern portion in a vertical direction to a height greater than a thickness of the first pattern portion,
wherein the second bank layer is not in contact with the second pattern portion and there is a space between the second bank layer and the second pattern portion, and
wherein the light-emission layer is on the first bank layer and within the space between the second bank layer and the second pattern portion.

2. The electroluminescent display device according to claim 1, wherein an angle between the first pattern portion and the second pattern portion is less than 90°.

3. The electroluminescent display device according to claim 1,
wherein a thickness of the first bank layer is smaller than a thickness of the second bank layer, and a width of the first bank layer is larger than a width of the second bank layer, and
wherein the first bank layer is formed of a hydrophilic material, and an upper portion of the second bank layer is formed of a hydrophobic material.

4. The electroluminescent display device according to claim 1, further comprising a circuit device layer including a thin film transistor between the substrate and the electrode, wherein the electrode is electrically connected with the thin film transistor.

5. The electroluminescent display device according to claim 1, wherein a height of the second bank layer is larger than a height of the second pattern portion of the first bank layer.

6. The electroluminescent display device according to claim 1, wherein the height of the second pattern portion is three times greater than the thickness of the first pattern portion.

7. An electroluminescent display device comprising:
a substrate;
an electrode on the substrate;
a first bank layer partially covering an end of the electrode and a partially uncovered portion of the electrode forming an exposed portion of the electrode;
a second bank layer on the first bank layer; and
a light-emission layer on the exposed portion of the electrode,
wherein the first bank layer includes a first pattern portion covering a side surface and an upper surface of the end of the electrode, and a second pattern portion upwardly extending from the first pattern portion in a vertical direction to a height greater than a thickness of the first pattern portion,
wherein the light-emission layer is on the first bank layer and within a space between the second bank layer and the second pattern portion.

* * * * *